United States Patent
Kussyk et al.

(10) Patent No.: US 10,514,414 B2
(45) Date of Patent: Dec. 24, 2019

(54) METHOD AND DEVICE FOR MONITORING AN ENERGY TRANSMISSION DEVICE

(71) Applicant: SIEMENS AKTIENGESELLSCHAFT, Munich (DE)

(72) Inventors: Jaroslaw Kussyk, Vienna (AT); Heiko Englert, Burgthann (DE)

(73) Assignee: Siemens Aktiengesellschaft, Munich (DE)

( * ) Notice: Subject to any disclaimer, the term of this patent is extended or adjusted under 35 U.S.C. 154(b) by 256 days.

(21) Appl. No.: 15/713,928

(22) Filed: Sep. 25, 2017

(65) Prior Publication Data

US 2018/0088167 A1    Mar. 29, 2018

(30) Foreign Application Priority Data

Sep. 23, 2016   (EP) .................................... 16190346

(51) Int. Cl.
*G01R 31/08* (2006.01)
*H02J 50/12* (2016.01)
(Continued)

(52) U.S. Cl.
CPC ......... *G01R 31/086* (2013.01); *G01R 31/026* (2013.01); *H02H 3/17* (2013.01);
(Continued)

(58) Field of Classification Search
CPC ............................... G01R 31/08; G01R 31/28
See application file for complete search history.

(56) References Cited

U.S. PATENT DOCUMENTS 6,245,065 B1 *   6/2001   Panescu ............. A61B 18/1206
                                                                606/40
7,180,300 B2      2/2007   Premerlani et al.
(Continued)

FOREIGN PATENT DOCUMENTS

EP       1669767 A1    6/2006
WO    03016850 A2    2/2003
(Continued)

*Primary Examiner* — Tung X Nguyen
(74) *Attorney, Agent, or Firm* — Laurence Greenberg; Werner Stemer; Ralph Locher

(57) ABSTRACT

A method monitors an energy transmission device, in particular an energy transmission line or an energy distribution network, via which electric current is transmitted at a predefined network frequency. An electrical measurement signal having at least one non-network frequency, i.e. a frequency which differs from the network frequency, or a non-network frequency band, is fed into the energy transmission device at a predefined position thereon. An electrical measured quantity related to the non-network frequency or the non-network frequency band is measured at the predefined position or a different position on the energy transmission device with the formation of at least one measured value or frequency-band-related measured value characteristic. A fault signal is generated if the measured value, the frequency-band-related measured value characteristic, a comparative value or comparative value characteristic formed with the measured value or the measured value characteristic indicates a fault in the energy transmission device.

17 Claims, 3 Drawing Sheets

(51) Int. Cl.
*H02H 3/17* (2006.01)
*H02H 7/26* (2006.01)
*H02H 5/10* (2006.01)
*G01R 31/02* (2006.01)

(52) U.S. Cl.
CPC ............... *H02H 5/10* (2013.01); *H02H 7/26* (2013.01); *H02H 7/261* (2013.01); *H02J 50/12* (2016.02); *G01R 31/085* (2013.01)

(56) References Cited

U.S. PATENT DOCUMENTS

| | | |
|---|---|---|
| 2003/0085715 A1 | 5/2003 | Lubkeman et al. |
| 2006/0125486 A1* | 6/2006 | Prennerlani .......... G01R 31/086 324/512 |
| 2016/0276820 A1 | 9/2016 | Olivas et al. |
| 2017/0052222 A1 | 2/2017 | Pasdar et al. |

FOREIGN PATENT DOCUMENTS

| | | |
|---|---|---|
| WO | 2005050229 A1 | 6/2005 |
| WO | 2015168260 A1 | 11/2015 |

* cited by examiner

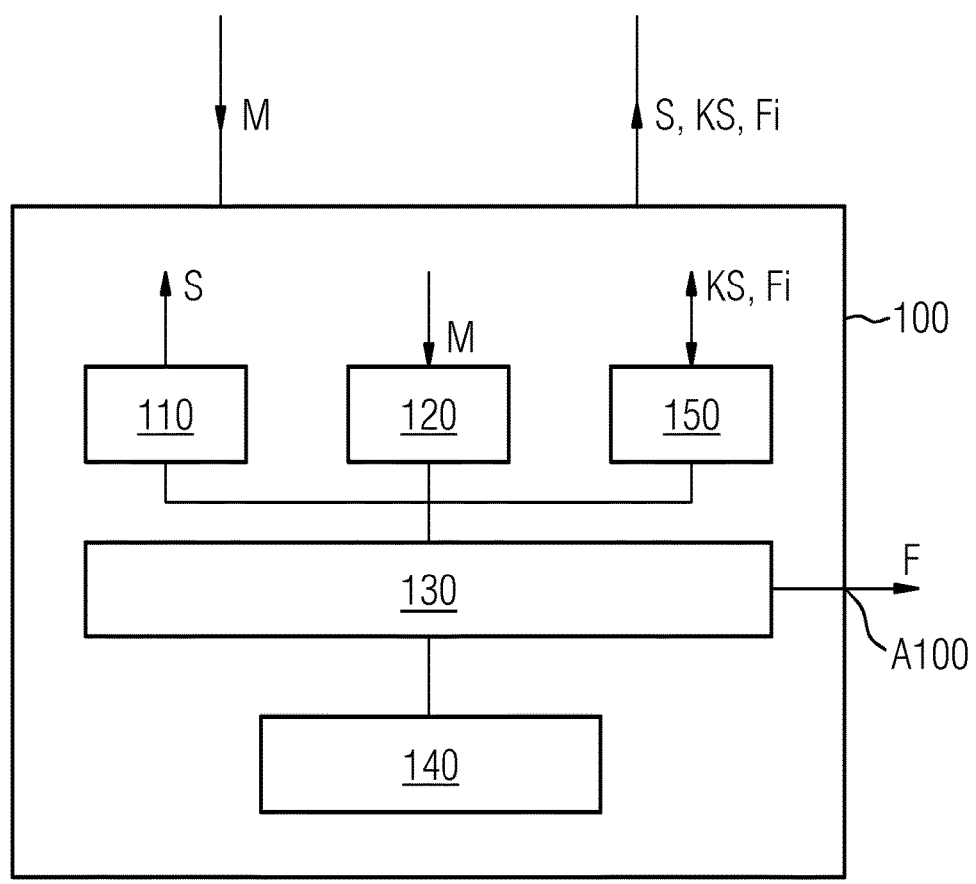

METHOD AND DEVICE FOR MONITORING AN ENERGY TRANSMISSION DEVICE

CROSS-REFERENCE TO RELATED APPLICATION

This application claims the benefit, under 35 U.S.C. § 119, of European patent application EP 16190346.3, filed Sep. 23, 2016; the prior application is herewith incorporated by reference in its entirety.

BACKGROUND OF THE INVENTION

Field of the Invention

The invention relates to a method for monitoring an energy transmission device, in particular an energy transmission line or an energy distribution network, via which electric current is transmitted at a predefined network frequency.

In the event of a line break in an energy transmission line or a phase conductor of the energy transmission line, and in the event of a subsequent fall of a line and onto the ground, very high-impedance faults can occur, particularly in the presence of high ground resistance. Particularly in medium-voltage networks with a solidly grounded neutral point, high-impedance faults represent a major problem, since these faults are difficult to detect and the high contact voltage which may still be present following the occurrence of the fault can endanger persons. In North America and in parts of Africa where medium-voltage networks with a solidly grounded neutral point are commonplace, primarily in the form of overhead lines, numerous accidents occur annually with fatal consequences due to high-impedance faults of this type.

The detection of the high-impedance faults is hindered, in particular, by the following factors:
a) The levels of the fault currents are difficult to distinguish from the operating currents/load currents when no faults are present.
b) Due to the solidly grounded neutral point of the feed-in transformer into the medium-voltage network, in the event of a single-pole fault no voltage shift occurs which could be detected by a voltage relay of the type used in compensated networks in Europe.
c) The networks are generally asymmetrically loaded during operation; consequently, the residual current over the transformer neutral point of a transformer feeding the medium-voltage network is not generally suitable as a detection criterion.

SUMMARY OF THE INVENTION

The object of the invention is to indicate a method for monitoring an energy transmission device which enables reliable fault detection, particularly for devices with a solidly grounded neutral point.

It is thus provided according to the invention that an electrical measurement signal having at least one non-network frequency, i.e. a frequency which differs from the network frequency, or a non-network frequency band, is fed into the energy transmission device at a predefined position thereon. An electrical measured quantity related to the non-network frequency or the non-network frequency band is measured at the predefined position or a different position on the energy transmission device with the formation of at least one measured value or frequency-band-related measured value characteristic. A fault signal is generated if the measured value, the frequency-band-related measured value characteristic, a comparative value or comparative value characteristic formed with the measured value or the measured value characteristic indicates a fault in the energy transmission device.

One significant advantage of the method according to the invention is that high-impedance faults with a solidly connected neutral point can also be reliably detected through the targeted feed-in of measurement signals having a non-network frequency or non-network frequency band provided according to the invention, since high-impedance faults at frequencies other than the network frequency, as discovered by the inventor, can make themselves more significantly noticeable than at the network frequency.

The method can be carried out particularly simply and therefore advantageously if the measured value or the frequency-band-related measured value characteristic is recorded with the formation of a reference value or reference characteristic at a time which is assumed to be fault-free. A fault signal is preferably generated if the present measured value or the present frequency-band-related measured value characteristic and/or a present comparative value or present comparative value characteristic formed with the present measured value or the present frequency-band-related measured value characteristic deviates from the reference value or reference characteristic beyond a predefined extent.

In one preferred design variant, it is provided that an electrical voltage having a non-network frequency is fed in at the predefined position as an electrical measurement signal and the amount and/or phase of the current is measured at the same position as the non-network frequency measured quantity.

Alternatively or additionally, according to a further advantageous design of the method, it can be provided that the measurement signal is fed in at a predefined position, referred to below as the first position, on the energy transmission device and the measured value or measured value characteristic is measured at a different position, referred to below as the second position, on the energy transmission device.

The line impedance, the line impedance characteristic, the surge impedance, the surge impedance characteristic in the frequency band, the attenuation of the energy transmission device or the attenuation characteristic of the energy transmission device in the frequency band can advantageously be formed as a reference value or reference characteristic. In this design, it is advantageous if the present line impedance, the present line impedance characteristic, the present surge impedance, the present surge impedance characteristic in the frequency band, the present attenuation of the energy transmission device and/or the attenuation characteristic of the energy transmission device in the frequency band is determined with the present measured value or the present frequency-band-related measured value characteristic (as a comparative value or comparative value characteristic). With a view to an evaluation in terms of the surge impedance and/or attenuation, the last-named variant can be implemented particularly simply if the feed-in and measurement are performed at different positions.

With regard to the evaluation of the measured values, it is regarded as advantageous if the frequency of the voltage is varied throughout a predefined non-network frequency band during the measurement and the amount and/or phase of the current for the frequency band is measured.

A first and a second transmission device preferably have a communication connection to one another which is based, in particular, on non-network frequency communication signals transmitted via the energy transmission device or on the measurement signals themselves (insofar as they are additionally used as communication signals). The feed-in of the measurement signal and the recording of the measured value or measured value characteristic is preferably synchronized via the communication connection.

It is particularly advantageous if the measured value, measured value characteristic, comparative value or comparative value characteristic is transmitted from the second transmission device to the first transmission device, in particular via the energy transmission device by means of a non-network frequency communication signal, and the first monitoring device generates the fault signal if the measured value, measured value characteristic, present comparative value or present comparative value characteristic indicates a fault in the energy transmission device.

With a view to a particularly reliable, in particular network-wide, monitoring, it is regarded as advantageous if two or more monitoring devices are connected to the energy transmission device at different positions, with which non-network frequency measurement signals are in each case fed into the energy transmission device and/or non-network frequency measured values or measured value characteristics are recorded and/or present comparative values or present comparative value characteristics are formed and/or auxiliary fault signals are generated specifically for each monitoring device. The measured values, the measured value characteristics, the present comparative values, the present comparative value characteristics and/or the auxiliary fault signals generated specifically for each monitoring device are preferably transmitted to a central protection device. The central protection device preferably generates the fault signal if one or more of the measured values or one or more of the measured value characteristics or one or more of the present comparative values or one or more of the present comparative value characteristics indicate a fault in the energy transmission device.

The non-network frequency of the electrical measurement signal or the non-network frequency band is preferably in a frequency range between 30 kHz and 30 MHz, in particular between 100 kHz and 500 kHz.

A voltage network, in particular a medium-voltage network, with a solidly grounded neutral point is preferably monitored with the method. A medium-voltage network is understood here to mean a network with a network voltage between 1 kV and 60 kV.

In addition, the invention relates to a monitoring device for monitoring an energy transmission device, in particular an energy transmission line or an energy distribution network, via which electric current is transmitted at a predefined network frequency.

With regard to a monitoring device of this type, it is provided according to the invention that the monitoring device has a measuring device which can measure an electrical measured quantity related to a non-network frequency or a non-network frequency band with the formation of at least one measured value or frequency-band-related measured value characteristic, and the monitoring device has an evaluation device which generates a fault signal if the measured value, the frequency-band-related measured value characteristic, a comparative value or a comparative value characteristic formed with the measured value or the measured value characteristic indicates a fault in the transmission device.

With regard to the advantages of the monitoring device according to the invention, reference is made to the description given above in connection with the method according to the invention.

In addition, the monitoring device preferably has a measurement signal generation unit which can feed an electrical measurement signal having at least one non-network frequency, i.e. a frequency which differs from the network frequency, or non-network frequency band into the energy transmission device at a predefined position thereon.

Furthermore, the monitoring device preferably has a communication device which can transmit measured values, measured value characteristics, present comparative values, present comparative value characteristics formed therewith or auxiliary fault signals generated specifically for each monitoring device to one or more other monitoring devices or to a central protection device. It is also possible for the measurement signals to be generated in the form of communication signals, i.e. the measurement signals themselves form communication signals; in such a case, the measurement signal generation unit and the communication device can be formed by one and the same unit or device.

In addition, the invention relates to a monitoring arrangement for monitoring an energy transmission device, in particular an energy transmission line or an energy distribution network, via which electric current is transmitted at a predefined network frequency.

With regard to a monitoring arrangement of this type, it is provided according to the invention that it has at least one monitoring device as described above and at least one measurement signal generation unit which can feed an electrical measurement signal having at least one non-network frequency, i.e. a frequency which differs from the main network frequency, or a non-network frequency band, into the energy transmission device.

The measurement signal generation unit is preferably formed by a component of the aforementioned monitoring device or a component of a different monitoring device disposed at a different position on the energy transmission device.

It is regarded as particularly advantageous if the monitoring arrangement has a central protection device to which the at least one monitoring device is connected and to which the measured values or measured value characteristics, present comparative values, present comparative value characteristics formed therewith or auxiliary fault signals generated specifically for each monitoring device are transmitted, and the central protection device is designed in such a way that it generates the fault signal if one or more of the measured values or one or more of the measured value characteristics or one or more of the present comparative values or one or more of the present comparative value characteristics indicate a fault in the energy transmission device or an auxiliary fault signal generated specifically for each monitoring device is received.

The invention furthermore relates to an energy transmission device.

It is provided according to the invention that at least one monitoring device as described above and/or a monitoring arrangement as described above is connected to the energy transmission device. The energy transmission device is preferably monitored with the monitoring device and/or the monitoring arrangement according to a method as described above.

The energy transmission device is preferably a medium-voltage network with a solidly grounded neutral point, a medium-voltage range of an energy distribution network with a solidly grounded neutral point or a medium-voltage energy transmission line with a solidly grounded neutral point.

Other features which are considered as characteristic for the invention are set forth in the appended claims.

Although the invention is illustrated and described herein as embodied in a method and device for monitoring an energy transmission device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 5 is a block diagram showing an example embodiment of a monitoring device according to the invention in greater detail.

DETAILED DESCRIPTION OF THE INVENTION

For the sake of clarity, the same reference numbers are always used in the figures for identical or comparable components.

Figure 1:
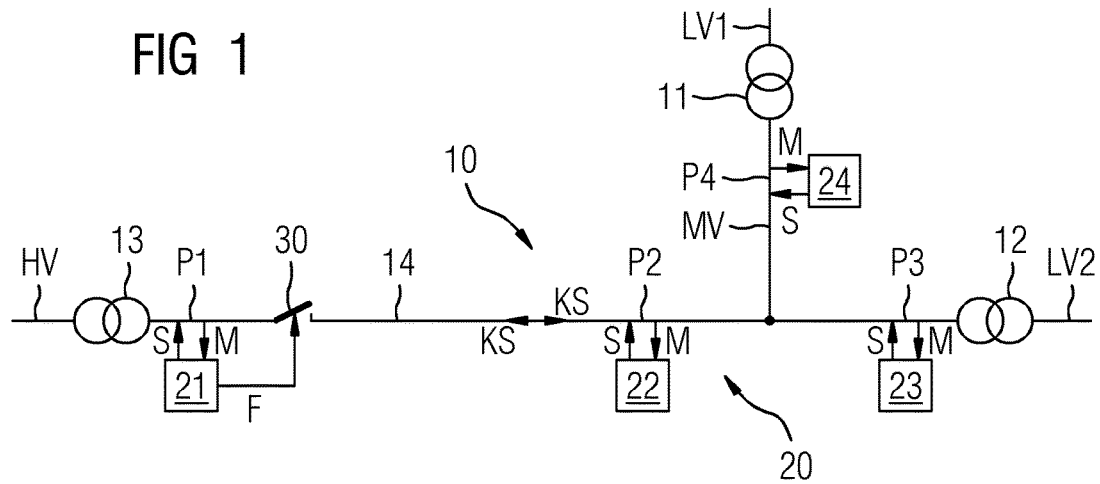
FIG. 1 is an illustration showing an example embodiment of a monitoring arrangement according to the invention, with reference to which an example embodiment of the method according to the invention is also explained by way of example.

Referring now to the figures of the drawings in detail and first, particularly to FIG. 1 thereof, there is shown an example embodiment of an energy distribution network 10, of which a medium-voltage range MV, a high-voltage range HV and two low-voltage ranges LV1 and LV2 are shown in FIG. 1.

The two low-voltage ranges LV1 and LV2 are connected in each case via a transformer 11 or 12 to the medium-voltage range MV. The medium-voltage range MV is connected to the high-voltage range HV via a transformer 13.

A first monitoring device 21 of a monitoring arrangement 20 having one or more monitoring devices 21 to 24 is connected at a first position P1 to the medium-voltage range MV of the energy distribution network 10. A second monitoring device 22 is connected at a second position P2 to the medium-voltage range MV of the energy distribution network 10, and a third and a fourth monitoring device 23 and 24 are connected at a third position P3 or at a fourth position P4 to the medium-voltage range MV of the energy distribution network 10.

The first monitoring device 21 and the second monitoring device 22 enclose an energy transmission line 14 of the medium-voltage range MV between them; this energy transmission line 14 is equipped with a switch 30 which enables a shutdown of the energy transmission line 14 and therefore an electrical disconnection of the medium-voltage range MV and the low-voltage ranges LV1 and LV2 from the high-voltage range HV.

For the protection of the energy distribution network 10, in particular the medium-voltage range MV of the energy distribution network 10, the monitoring device 20 can be operated, for example, as now described.

The first monitoring device 21 feeds an electrical measurement signal S having a non-network frequency, i.e. a frequency which differs from the network frequency of the energy distribution network 10, in particular the medium-voltage range MV, into the energy distribution network 10 at a first position P1 by a measurement signal generation unit, not shown in FIG. 1 in the interests of clarity.

At the first position P1, the first monitoring device 21 measures with a measuring device, similarly not shown in FIG. 1 in the interests of clarity, an electrical measured quantity M related to the respective non-network frequency of the measurement signal S with the formation of a measured value.

It is particularly advantageous if the frequency of the measurement signal S is varied throughout a predefined non-network frequency band during the measurement by the measuring device of the monitoring device 21; such a variation throughout the frequency band enables the measuring device of the first monitoring device 21 to measure the electrical measured quantity M with the formation of a frequency-band-related measured value characteristic.

The first monitoring device 21 will evaluate the frequency-band-related measured value characteristic and generate a fault signal F if the frequency-band-related measured value characteristic indicates a fault in the energy distribution network 10, in particular the energy transmission line 14. The frequency-band-related measured value characteristic is preferably checked for any fault using a reference characteristic RV (see FIG. 2) which was recorded by measuring the measured value M in the non-network frequency band at a time or in a time window which is assumed to be fault-free or was actually fault-free.

The impedance characteristic in the frequency band can advantageously be formed as a reference characteristic RV. In this design, the present impedance characteristic in the frequency band is preferably determined with the present frequency-band-related measured value characteristic as a comparative value characteristic.

Figure 2:
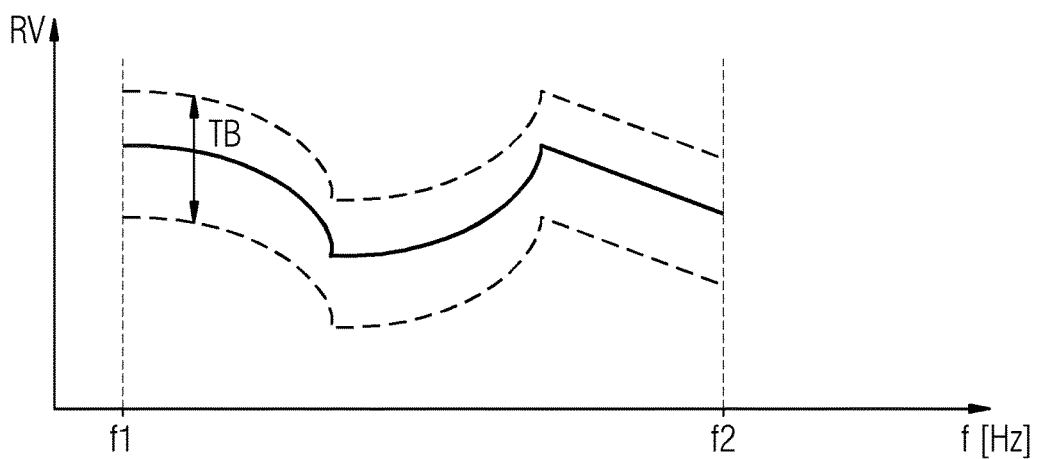
FIG. 2 is a graph showing a reference characteristic with which it is possible to check whether a fault is present and a fault signal is to be generated.

FIG. 2 shows an example embodiment of a reference characteristic RV over the frequency f. The non-network frequency band for which the reference characteristic RV has been generated extends in the example embodiment according to FIG. 2 from a lower frequency f1 (e.g. F1=100 kHz) to an upper frequency f2 (e.g. F2=500 kHz).

The first monitoring device 21 will generate the fault signal F, for example, if the present frequency-band-related measured value characteristic or a comparative value characteristic formed therewith (e.g. the present surge impedance or attenuation characteristic) deviates from the reference characteristic RV beyond a predefined extent. FIG. 2 shows by way of example a tolerance band which represents a tolerable extent of deviations from the reference characteristic RV.

The first monitoring device 21 can feed an electrical voltage as the electrical measurement signal S at the first position P1 into the energy distribution network 10; as explained above, it will preferably vary the frequency of the voltage throughout the non-network frequency band shown by way of example in FIG. 2 between the lower frequency f1 and the upper frequency f2.

The first monitoring device 21 can measure, for example, the amount and/or phase of the current as the measured value M for the non-network frequency band and can compare the respective presently measured amount and/or phase of the current characteristic with the previously determined reference characteristic RV, again in terms of the amount and/or phase, for the current and/or, with the amount and/or phase of the current characteristic (and also the corresponding voltage characteristic), can determine as a comparative value characteristic an impedance characteristic on which the comparison below is based. The comparison can be carried out using conventional mathematical methods, such as, for example, on the basis of cross-correlation functions, pattern recognition, through (linearly or non-linearly weighted) summation or integration of deviation values over the characteristic, etc., and, in particular, also on the basis of neural networks on the basis of a model-based (substitute model of the electrical network) state estimation.

If the presently measured amount and/or phase of the current characteristic of the present comparative value characteristic is within the tolerance band TB for the reference characteristic RV in FIG. 2, the monitoring device 21 will assume that no fault has occurred in the energy distribution network 10 or on the energy transmission line 14 and will forego the generation of a fault signal F.

Conversely, if the first monitoring device 21 establishes that the presently measured amount and/or phase of the current or the present comparative value characteristic deviates from the reference characteristic RV according to FIG. 2 beyond the tolerance band TB, it will infer a fault and generate the fault signal F.

The fault signal F may serve, for example, as a switching signal for the switch 30 which, if the fault signal F is present, opens and disconnects the energy transmission line 14 from the high-voltage range HV or from the transformer 13.

The monitoring devices 22, 23 and 24 connected at the positions P2, P3 and P4 can be operated in a corresponding manner or in exactly the same way as the first monitoring device 21. In other words, they can also autonomously feed in an electrical measurement signal S and measure an electrical measured value M and infer a fault depending on the measured value M. The measurement signals S of the monitoring devices 21, 22, 23 and 24 connected at the positions P1, P2, P3 and P4 differ from one another with a view to a differentiation of the signals, preferably in the time-frequency domain.

In order to prevent the monitoring devices 21 to 24 from feeding electrical measurement signals at random times and interfering with one another, resulting in a distortion of the measurement results, it is regarded as advantageous if the monitoring devices 21 to 24 are synchronized with one another. A synchronization of this type is preferably carried out via communication signals KS which are transmitted via a separate communication network or, particularly preferably, via the energy distribution network 10. With regard to the transmission of the communication signals KS via the energy distribution network 10, known communication technologies can be used, such as those known, for example, under the technical term "power line carrier technology".

With a view to the operation of the monitoring arrangement 20, it is regarded as particularly advantageous if one of the monitoring devices 21 to 24, for example the first monitoring device 21, acts as a central protection device or master device to which the remaining monitoring devices 22 to 24 are connected as slave devices, for example via the aforementioned communication signals KS. By means of the communication signals KS, the monitoring devices 22 to 24 can transmit the measured values or measured value characteristics recorded by them, comparative values or comparative value characteristics, or, where appropriate, auxiliary fault signals already generated specifically for each monitoring device, to the first monitoring device 21 acting as a central protection device which subsequently performs the evaluation of the obtained measured value characteristics or comparative value characteristics and/or, in the event of a reception of an auxiliary fault signal generated specifically for each monitoring device, generates a central fault signal F to switch off the switch 30.

In connection with a possible operational method of the monitoring arrangement 20 according to FIG. 1, it has been assumed above by way of example that each of the monitoring devices 21 to 24 in each case generates electrical measurement signals S itself and feeds them into the energy distribution network and records measured values or measured value characteristics related to the measurement signal which it has itself fed in. Alternatively, it is possible to carry out the feed-in of measurement signals S and the recording of measured values M at different positions P1 to P4 in the energy distribution network 10. This will be explained in detail below by way of example with reference to FIG. 3.

Figure 3:
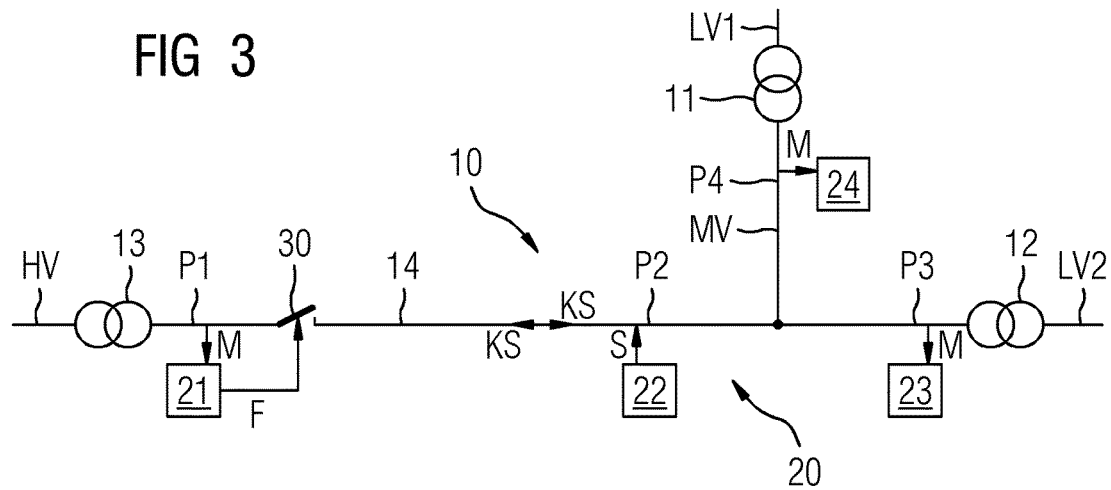
FIG. 3 is an illustration showing a different variant for an operation of monitoring devices of the monitoring arrangement with reference to the monitoring arrangement according to FIG. 1.

In the representation according to FIG. 3, it is assumed by way of example that the second monitoring device 22 feeds a measurement signal S at the second position P2 into the energy distribution network 10 or the energy transmission line 14. The measurement signal S is preferably fed in so that the frequency of the measurement signal S is varied throughout a predefined non-network frequency band, for example the frequency band between the lower frequency f1 and the upper frequency f2 according to FIG. 2.

Synchronized with the measurement signal S, preferably by a communication signal KS, the first monitoring device 21 can measure the measured value M for the non-network frequency band and can measure a frequency-band-related measured value characteristic which relates to the measurement signal S of the second monitoring device 22. The first monitoring device 21 can then compare the frequency-band-related measured value characteristic with a reference characteristic RV (see FIG. 2) which it has previously recorded for a time assumed to be fault-free with a feed-in of the measurement signal S by the second monitoring device 22. If the first monitoring device 21 establishes that the presently recorded frequency-band-related measured value characteristic or the present comparative value characteristic deviates from the reference value RV beyond a predefined extent, it generates the fault signal F, as already explained above in connection with FIGS. 1 and 2.

In a corresponding manner, the first monitoring device 21 can interwork with the third monitoring device 23 and the fourth monitoring device 24 and can record measured values which relate to measurement signals which have been fed in by the third and fourth monitoring device 23 and 24.

In addition, it is possible to transpose feed-in positions and measurement positions. Thus, for example, the first monitoring device 21 can serve to feed in the electrical measurement signal S, and the remaining monitoring devices 22 to 24 record measured values or frequency-band-related measured value characteristics, as explained above. In the last-mentioned scenario, it is advantageous if the monitoring devices 22 to 24 themselves in each case evaluate the measured values or measured value characteristics and generate an auxiliary fault signal specifically for each monitoring device if measured value characteristics presently measured or present comparative value characteristics formed therewith deviate from stored reference characteristics RV beyond a predefined extent. The auxiliary fault signals generated specifically for each monitoring device are preferably transmitted to the first monitoring device 21 acting as a central protection device which can then generate the central fault signal F to switch off the switch 30.

It is also possible for all other monitoring devices always to record measured values M if one of the monitoring devices actively feeds in a measurement signal S. For example, the monitoring devices 23 and 24 can perform measurements in parallel with the first monitoring device and, where appropriate, generate an auxiliary fault signal specifically for each monitoring device if the second monitoring device generates the measurement signal S (see FIG. 3). The same applies accordingly to a feed-in of a measurement signal by the first, third or fourth monitoring device 21, 23 or 24.

In the recording of the reference characteristics and the measurement of the present measured value characteristics, the frequency of the measurement signal S can be varied throughout the non-network frequency band so that the different frequencies are generated temporally after one another. Alternatively, it is possible to generate a broadband measurement signal S which simultaneously covers the entire non-network frequency band (or sections thereof) during the measurement; in the last-mentioned case, the measured value is preferably measured in a frequency-selective manner by means of filtering or is at least evaluated in a frequency-selective manner.

Figure 4:
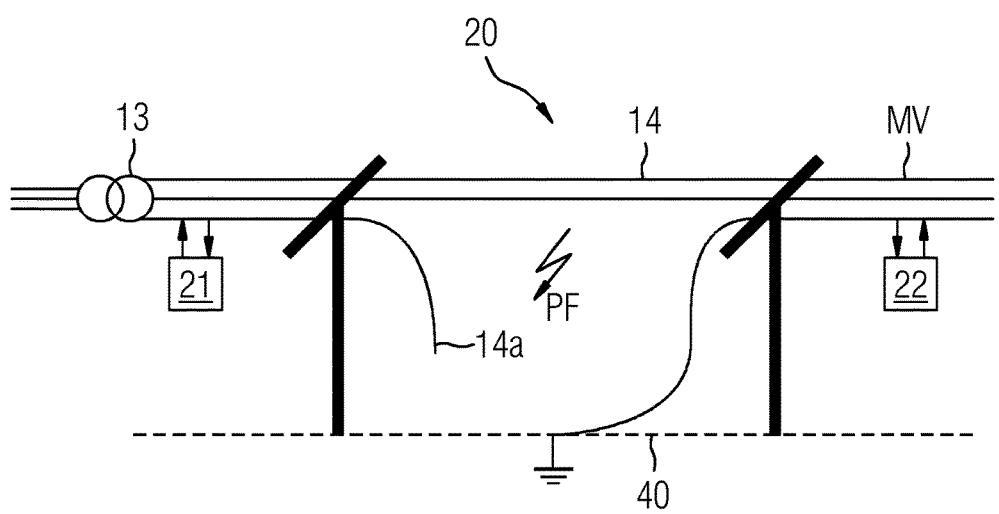
FIG. 4 is an illustration showing a section of an energy transmission line of an energy distribution network which is monitored by the monitoring arrangement according to FIG. 1, in the event of a high-impedance fault on a phase line of the energy transmission line.

FIG. 4 shows by way of example a high-impedance fault at a fault position PF in the medium-voltage range MV of the energy distribution network 10 according to FIGS. 1 and 3 in greater detail. It can be seen that a phase conductor 14a of the three-phase energy transmission line 14 is broken and has established a ground contact to the ground 40. If the medium-voltage range MV is a medium-voltage network with a solidly grounded neutral point, a fault of this type (cf., for example, the monitoring device 21 in FIG. 4) is generally has a high impedance and is detectable only with difficulty. Due to the fault detection procedure explained above in connection with FIGS. 1 to 3, specifically due to the feed-in of a non-network frequency measurement signal and the recording of a non-network frequency measured quantity, it is reliably possible to detect faults, particularly for those monitoring devices which are located close to the fault position PF, such as, for example, the first monitoring device 21 and or the second monitoring device 22.

FIG. 5 shows an example embodiment of a monitoring device 100 which can be used as one of the monitoring devices 21 to 24 of the monitoring arrangement 20 according to FIGS. 1 to 4.

It can be seen that the monitoring device 100 has a measurement signal generation device 110 which can feed in an electrical measurement signal S having at least one non-network frequency or a non-network frequency band at a predefined position on an energy transmission device, i.e., for example, the energy distribution network 10 or the energy transmission line 14 according to FIGS. 1 to 4.

In addition, the monitoring device 100 has a measuring device 120 which can measure an electrical measured quantity M with the formation of at least one measured value frequency-band-related measured value characteristic.

An evaluation device 130 which controls the measurement signal generation device and evaluates the measurement results of the measuring device 120, for example with the formation of present comparative value characteristics, is connected to the measurement signal generation device 110 and the measuring device 120.

A memory 140 in which reference values or reference characteristics RV which have been measured at times which are assumed to be fault-free are stored is preferably connected to the evaluation device 130. Using reference values or reference characteristics, the evaluation device 130 can generate a fault signal F (for example if it operates as a master device) or an auxiliary fault signal Fi specifically for each monitoring device (for example if it operates as a slave device), if it infers a fault during a comparison of presently recorded measured values or measured value characteristics or present comparative values or present comparative value characteristics with the stored reference values or stored reference characteristics.

In addition, the monitoring device 100 preferably has a communication device 150 which enables a communication with other monitoring devices and/or a central protection device. The communication device 150 is preferably suitable for outputting, by means of communication signals KS, measured values or measured value characteristics and/or auxiliary fault signals Fi generated specifically for each monitoring device. If the monitoring device 100 operates as a central protection device, it outputs fault signals F preferably on a separate fault signal output A100.

The measurement signal generation unit 110, the measuring device 120 and the evaluation device 130 can be formed through software modules of a data processing device which preferably comprises one or more microprocessors.

Although the invention has been illustrated and described in greater detail by means of preferred example embodiments, the invention is not limited by the disclosed examples and other variations may be derived therefrom by the person skilled in the art without departing from the protective scope of the invention.

The following is a summary list of reference numerals and the corresponding structure used in the above description of the invention:

10 Energy distribution network
11 Transformer
12 Transformer
13 Transformer
14 Energy transmission line
14a Phase conductor
20 Monitoring arrangement
21 Monitoring device
22 Monitoring device
23 Monitoring device
24 Monitoring device
30 Switch
40 Ground
100 Monitoring device
110 Measurement signal generation device
120 Measuring device
130 Evaluation device
140 Memory
150 Communication device
A100 Fault signal output
F Fault signal Fi Auxiliary fault signal
f Frequency
f1 lower frequency
f2 upper frequency
HV High-voltage range
KS Communication signals
LV1 Low-voltage range
LV2 Low-voltage range
M Measured quantity
MV Medium-voltage range
PF Fault position
P1 Position
P2 Position
P3 Position
P4 Position
PF Fault position
RV Reference characteristic
S Measurement signal
TB Tolerance band

The invention claimed is:

1. A method for monitoring an energy transmission device via which electric current is transmitted at a predefined network frequency, which comprises the steps of:
   feeding an electrical measurement signal having at least one non-network frequency, namely a frequency which differs from the predefined network frequency, or a non-network frequency band into the energy transmission device at a predefined position thereon;
   measuring an electrical measured quantity related to the non-network frequency or the non-network frequency band at the predefined position or at a different position on the energy transmission device with a formation of at least one measured value or frequency-band-related measured value characteristic; and
   generating a fault signal if the measured value, the frequency-band-related measured value characteristic, a comparative value or a comparative value characteristic formed with the measured value or the frequency-band-related measured value characteristic indicates a fault in the energy transmission device.

2. The method according to claim 1, which further comprises:
   recording the measured value or the frequency-band-related measured value characteristic with a formation of a reference value or a reference characteristic at a time which is assumed to be fault-free; and
   generating the fault signal if a present measured value or a present frequency-band-related measured value characteristic or a present comparative value or a present comparative value characteristic formed with the present measured value or the present frequency-band-related measured value characteristic deviates from the reference value or the reference characteristic beyond a predefined extent.

3. The method according to claim 1, which further comprises
   feeding an electrical voltage having the non-network frequency in at the predefined position as the electrical measurement signal; and
   measuring an amount and/or phase of a current at a same position as the electrical measured quantity being a non-network frequency measured quantity.

4. The method according to claim 3, which further comprises:
   varying a frequency of the electrical voltage throughout a predefined non-network frequency band during a measurement; and
   measuring the amount and/or phase of a current for the predefined non-network frequency band.

5. The method according to claim 1, which further comprises:
   forming a line impedance, a line impedance characteristic, a surge impedance, a surge impedance characteristic in the non-network frequency band, an attenuation of the energy transmission device or an attenuation characteristic of the energy transmission device in the non-network frequency band as a reference value or a reference characteristic at a time assumed to be fault-free; and
   determining a present line impedance, a present line impedance characteristic, a present surge impedance, a present surge impedance characteristic in the non-network frequency band, a present attenuation of the energy transmission device or the attenuation characteristic of the energy transmission device in the non-network frequency band with a present measured value or a present frequency-band-related measured value characteristic as the comparative value or the comparative value characteristic.

6. The method according to claim 1, which further comprise:
   feeding in the electrical measurement signal with a first monitoring device at the predefined position on the energy transmission device, referred to below as a first position; and
   measuring a measured value or a measured value characteristic with a second monitoring device at a different position on the energy transmission device, referred to below as a second position.

7. The method according to claim 6, wherein the first and second monitoring devices have a communication connection to one another which is based on non-network frequency communication signals transmitted via the energy transmission device and/or on measurement signals which additionally serve as communication signals, and a feed-in of the electrical measurement signal and a recording of the measured value or the frequency-band related measured value characteristic are synchronized via the communication connection.

8. The method according to claim 6, which further comprises:
   transmitting the measured value, the frequency-band related measured value characteristic, the comparative value and/or the comparative value characteristic from the second monitoring device to the first monitoring device, the energy transmission device by means of a non-network frequency communication signal; and
   generating, via the first monitoring device, the fault signal if the measured value, the frequency-band related measured value characteristic, the comparative value or the comparative value characteristic indicates the fault in the energy transmission device.

9. The method according to claim 1, which further comprises:
   connecting at least two monitoring devices to the energy transmission device at different positions, with which non-network frequency measurement signals are in each case fed into the energy transmission device and/or non-network frequency measured values or measured value characteristics are recorded and/or present comparative values or present comparative value characteristics are formed and/or auxiliary fault signals are generated specifically for each monitoring device;

transmitting the measured values, the measured value characteristics, present comparative values, present comparative value characteristics and/or auxiliary fault signals generated specifically for each of the monitoring devices to a central protection device; and generating, via the central protection device, the fault signal if the at least one measured value or the at least one measured value characteristic or at least one present comparative values or at least one present comparative value characteristics indicate the fault in the energy transmission device.

10. The method according to claim 1, wherein the non-network frequency of the electrical measurement signal or the non-network frequency band is in a frequency range between 30 kHz and 30 MHz.

11. The method according to claim 1, which further comprises monitoring a voltage network with a solidly grounded neutral point with the method.

12. The method according to claim 1, wherein the energy transmission device is an energy transmission line or an energy distribution network.

13. The method according to claim 1, wherein the non-network frequency of the electrical measurement signal or the non-network frequency band is in a frequency range between 100 kHz and 500 kHz.

14. A monitoring device for monitoring an energy transmission device via which electric current is transmitted at a predefined network frequency, the monitoring device comprising:

a measuring device measuring an electrical measured quantity related to a non-network frequency or a non-network frequency band resulting in a formation of at least one measured value or a frequency-band-related measured value characteristic; and an evaluation device generating a fault signal if the measured value, the frequency-band-related measured value characteristic, a comparative value or comparative value characteristic formed with the measured value or the frequency-band-related measured value characteristic indicates a fault in the energy transmission device.

15. A monitoring configuration for monitoring an energy transmission device via which electric current is transmitted at a predefined network frequency, the monitoring configuration comprising:

at least one monitoring device having a measuring device measuring an electrical measured quantity related to a non-network frequency or a non-network frequency band resulting in a formation of at least one measured value or a frequency-band-related measured value characteristic;

an evaluation device generating a fault signal if the measured value, the frequency-band-related measured value characteristic, a comparative value or a comparative value characteristic formed with the measured value or the frequency-band-related measured value characteristic indicates a fault in the energy transmission device; and at least one measurement signal generation unit which can feed an electrical measurement signal having the at least one non-network frequency or the non-network frequency band into the energy transmission device.

16. The monitoring configuration according to claim 15, wherein said monitoring device has a central protection device to which said monitoring device is connected and to which the measured values, the frequency-band-related measured value characteristics, the comparative values or the comparative value characteristics or auxiliary fault signals generated specifically for each monitoring device are transmitted; and further comprising a central protection device configured in such a way that said central protection device generates the fault signal if the at least one measured value, the frequency-band-related measured value characteristic, the comparative value or the comparative value characteristic indicates the fault in the energy transmission device or an auxiliary fault signal generated specifically for each monitoring device is received.

17. An energy transmission configuration, comprising:

a energy transmission device being a medium-voltage network with a solidly grounded neutral point, a medium-voltage range of an energy distribution network with the solidly grounded neutral point or a medium-voltage energy transmission line with a solidly grounded neutral point;

a monitoring configuration for monitoring said enemy transmission device via which electric current is transmitted at a predefined network frequency, said monitoring configuration containing:

at least one monitoring device having a measuring device measuring an electrical measured quantity related to a non-network frequency or a non-network frequency band resulting in a formation of at least one measured value or a frequency-band-related measured value characteristic;

an evaluation device generating a fault signal if the measured value, the frequency-band-related measured value characteristic, a comparative value or a comparative value characteristic formed with the measured value or the frequency-band-related measured value characteristic indicates a fault in the enemy transmission device; and at least one measurement signal generation unit which can feed an electrical measurement signal having the at least one non-network frequency or the non-network frequency band into said enemy transmission device.

* * * * *